United States Patent
Brooksby et al.

(10) Patent No.: US 6,262,672 B1
(45) Date of Patent: Jul. 17, 2001

(54) REDUCED COST AUTOMATIC METER READING SYSTEM AND METHOD USING LOCALLY COMMUNICATING UTILITY METERS

(75) Inventors: Glen William Brooksby, Glenville; Daniel David Harrison, Delanson; Daniel Arthur Staver, Scotia; Ertugrul Berkcan, Schenectady; Ralph Thomas Hoctor, Saratoga Springs, all of NY (US); Wolfgang Daum, Louisville, KY (US); Kenneth Brakeley Welles, II, Scotia, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/134,112

(22) Filed: Aug. 14, 1998

(51) Int. Cl.[7] .................................................. G06F 17/00
(52) U.S. Cl. ...................... 340/870.1; 702/60; 702/62; 702/64; 340/870.05
(58) Field of Search ...................... 340/870.01, 870.02, 340/870.05; 702/60, 62, 64; 318/716; 324/115, 141, 142

(56) References Cited

U.S. PATENT DOCUMENTS

| | | |
|---|---|---|
| 3,702,460 | 11/1972 | Blose . |
| 3,947,762 * | 3/1976 | Hug ...................................... 324/142 |
| 3,967,264 | 6/1976 | Whyte et al. . |
| 4,302,750 | 11/1981 | Wadhwani et al. . |
| 4,408,186 | 10/1983 | Howell . |
| 4,471,355 | 9/1984 | Hardy et al. . |
| 4,786,903 | 11/1988 | Grindahl et al. . |
| 4,792,946 | 12/1988 | Mayo . |
| 5,155,481 | 10/1992 | Brennan, Jr. et al. . |
| 5,229,713 * | 7/1993 | Bullock ................................ 324/142 |
| 5,243,338 | 9/1993 | Brennan, Jr. et al. . |
| 5,301,121 * | 4/1994 | Garverick et al. ...................... 702/60 |
| 5,311,581 | 5/1994 | Merriam et al. . |
| 5,404,127 | 4/1995 | Lee et al. . |
| 5,450,007 * | 9/1995 | Payne ................................. 324/141 |
| 5,537,333 * | 7/1996 | Hemminger et al. .................. 702/62 |
| 5,548,527 * | 8/1996 | Hemminger et al. .................. 702/60 |
| 5,559,377 | 9/1996 | Abraham . |
| 5,594,331 | 1/1997 | White et al. . |
| 5,696,501 | 12/1997 | Ouellette et al. . |
| 5,994,892 * | 11/1999 | Turino ............................. 340/870.02 |
| 5,995,911 * | 11/1999 | Hart ..................................... 702/64 |

OTHER PUBLICATIONS

"Automatic Meter Reading System Using Locally Communicating Utility Meters," KB Welles, III, W. Daum; Serial No. 09/132,080 (GE docket RD–26093), filed Aug. 10, 1998.

"Method and Apparatus for Performing the Register Functions for a Plurality of Metering Devices at a Common Node," M. Ouellette et al.; Serial No. 08/284,249, filed Aug. 2, 1994.

"Method and Apparatus for Performing the Register Functions for a Plurality of Metering Devices at a Common Node," M. Ouellette et al.; Serial No. 08/824,575, filed Mar. 26, 1997.

* cited by examiner

Primary Examiner—Michael Horabik
Assistant Examiner—Albert K. Wong
(74) Attorney, Agent, or Firm—Jill M. Breedlove; Douglas E. Stoner

(57) ABSTRACT

A low cost and easy to assemble communicating utility meter provides selectable measurement, calibration, display, and communications means so as to be re-configurable based on several factors including; harmonic content of the power signal measured, LCD display alternatives, time of use measurements, bandpass filter settings, power quality measurements, PLC communications alternatives, radio frequency communications alternatives, optical communications alternatives, and hard wire communications alternatives.

19 Claims, 11 Drawing Sheets

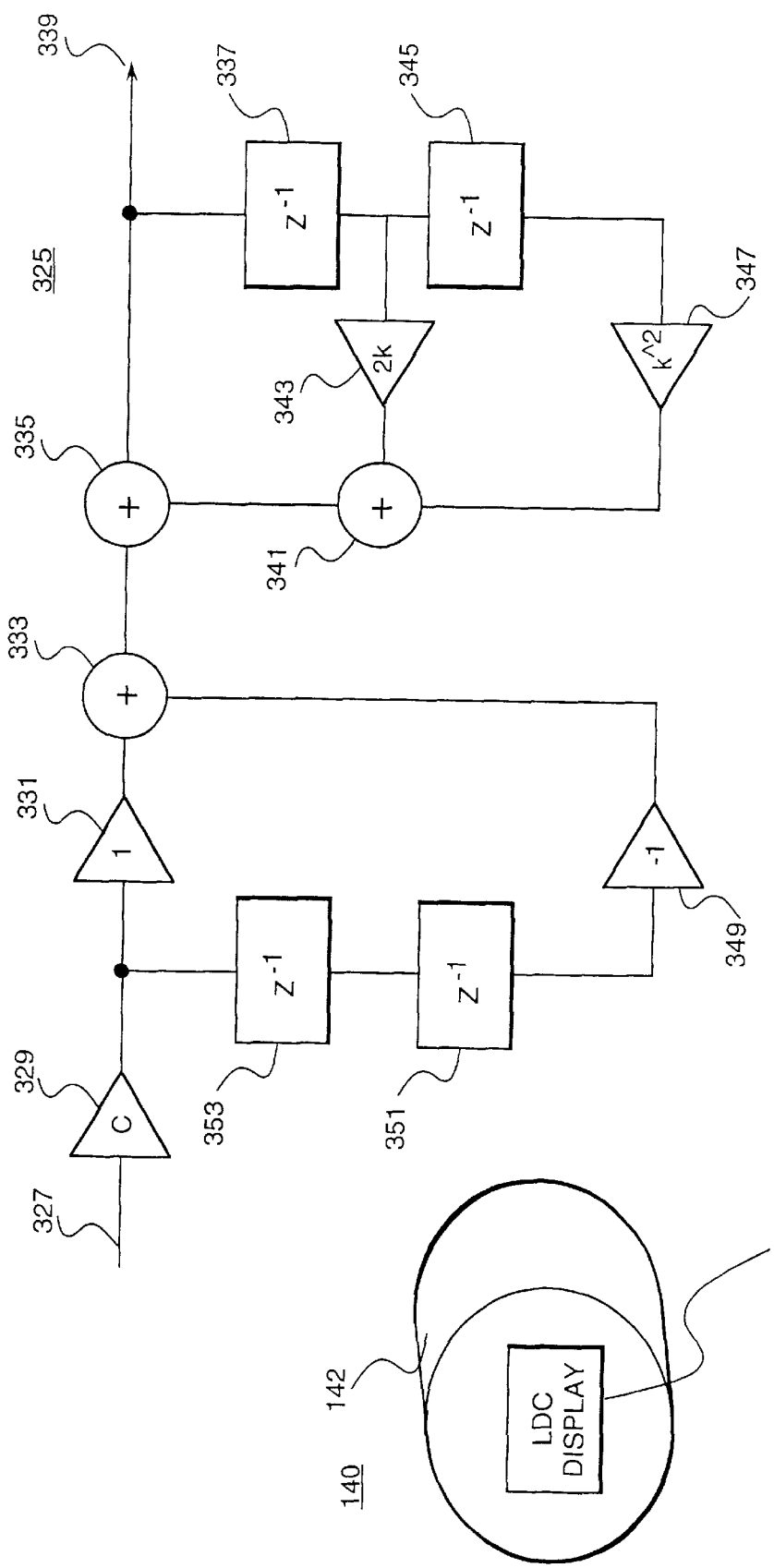

REDUCED COST AUTOMATIC METER READING SYSTEM AND METHOD USING LOCALLY COMMUNICATING UTILITY METERS

CROSS REFERENCE TO RELATED APPLICATIONS

This application claims the benefit of U.S. Provisional Application Ser. No. 60/055,904 filed Aug. 15, 1997. Additionally, this application is related to co-pending application Ser. No. 09/132,080, filed Aug. 10, 1998, now abandoned, and co-pending application Ser. No. 09/522,383, filed Mar. 10, 2000, entitled "AUTOMATIC METER READING SYSTEM USING LOCALLY COMMUNICATING UTILITY METERS", herein incorporated by reference.

BACKGROUND OF THE INVENTION

This invention relates to power line communication systems, and more particularly to a power line communication system that is re-configurable to adapt the utility meter to the specific utility usage and display characteristics of the attached dwelling.

Present utility meter communication devices may employ several electronic parts which result in a high cost of acquisition and maintenance of the communication hardware. It is desirable to have a simple and adaptable utility meter communications system with few parts that can communicate with other utility meters and with a central database using standard protocols.

Currently there are numerous method available for utility meters to communicate to a central location. There are wireless methods, such as those marketed by ITRON™, CELLNET™, and standard protocols that operate in the 900 MHz ISM band. There are methods utilizing Power Line Carrier (PLC) techniques, such as those marketed by INTELLON™. Other methods include the use of integrated telephone modems. Additionally, communication modalities include optical communications, such as industry standard Infrared Data Association (IRDA), or direct communication with an external device via a serial port. In yet another communicating mode, one utility meter may function as a "bridge" for communications between other utility meters and a central hub, or to pass information in a daisy-chain manner through meters and eventually to a hub. It is desirable to have a utility meter that can be easily adapted to communicate using a variety of communication methods and protocols.

In electronic utility metering applications, conflicting demands exist for flexibility of metering functions and a low cost electronics metering platform. It is desirable to have a utility meter that uses "soft-key" to select measurement, calibration, and display features of the utility meter.

While LCD (Liquid Crystal Display) driver integrated circuits are readily available from many commercial sources, they are costly for high volume applications which have simple display requirements, such as electric meters. Typical LCD driver implementations use analog circuits to develop the multiple voltage levels required to drive multiplexed LCDs. Some implementations use voltage references and voltage multipliers to produce the required voltages which are coupled onto the LCD driver lines as required. Other drivers use resistive dividers to produce voltages necessary to drive the LCD segments. Resistive dividers require external parts and consume additional power. It is desirable to have a low cost and low power LCD driver which utilizes a microprocessor to drive the LCD display.

High volume electric meters, such as residential electric meters, are typically designed with cost economy as a primary goal—a large contributor to the cost of such a meter is the power supply. Thus, it is important to design the meter optimizing the cost of the power supply. When power is removed from the typical utility meter it is important that the meter power supply contain enough stored energy to allow the meter to continue to function for a short time (i.e., ≈100 ms) so as to store important information, such as accumulated kilowatt-hours, in non-volatile memory. The alternative is to simply lose all information stored in volatile memory when power is lost. Providing an appropriate power-off sequence for the meter can reduce the energy requirement of the power supply, saving cost in the meter while still allowing important information to be saved.

In a typical solid state electric meter many functions of the meter such as metering algorithms, time-keeping, display, communications, etc., are controlled by a central processor. Each of these functions has a varying degree of importance in the event of a power failure. It is desirable to have a utility meter with an appropriately sized power supply to enable the utility meter to recover from a loss of power in a predictable manner.

In cost sensitive applications such as residential electricity meters, typical assembly techniques which include wires and soldered electrical connectors add unnecessary cost to the electric meter. A typical assembly technique includes soldering to the voltage bus-bar wires with relatively expensive connectors which are then attached to the printed wiring board (PWB) during assembly. It is desirable to have a utility meter that can be quickly and easy assembled without the use of soldered connections, screws, and wire bundles.

Traditionally, an iterative approach has been used in the calibration of residential electromechanical and electronic electricity meters, requiring a high accuracy meter standard, a single-bit test output signal, and multiple calibration cycles or multiple calibration stations under various test conditions. Traditionally, the test setup uses fixed currents at 3 Amps, and 30 Amps for these calibration points as required by the utility industry. These procedures require a count of the number of transitions of the single-bit test output signal over a fixed period of time to calibration the meter. It is desirable to employ a utility meter that can be quickly calibrated and accurately calibrated without having to count the number of transitions of a single-bit output signal.

BRIEF SUMMARY OF THE INVENTION

The present invention addresses the foregoing needs by providing a power line communications system that is built to be modular so as to be re-configurable through the use of hardwire re-configurable jumper wires or soft-keys. Reconfiguration of the power line communications system is based on factors including: harmonic content of the power signal measured, the selection of an alternative electronic display, communication protocols with external devices, whether to provide time of use measurements, band-pass filter settings, low-pass filter settings, high-pass filter settings, and power quality measurements.

In a further exemplary embodiment a digital integrator is employed which integrates alternating current signals while at the same time is insensitive to residual direct current sub-components of the alternating current signals within the electronic utility meter.

In a further exemplary embodiment a liquid crystal display (LCD) driver is employed in the electronic utility meter which utilizes a capacitor multiplexer, wherein an array of multi-level voltage signals are generated by arranging a plurality of capacitors, having preselected capacitance values, and being coupled to a multiplexer, so as to drive the LCD with the multi-level voltage signals.

In a further exemplary embodiment a method of powering down the electronic utility meter is employed which selectively removes power from functions within the meter and stores critical operating parameters in non-volatile memory based on respective voltage levels of a monitored internal power supply signal.

In a further exemplary embodiment a method of calibrating the electronic utility meter to obtain optimal utility usage measurements is employed where utility usage measurements are made at the user site and adjustments are made on-the-fly to compensate for electronic utility meter sensor variability, circuitry variability, and user site usage data variability.

In a further exemplary embodiment components are employed to reduce the amount of soldering and assembly time of the current sensors employed in the electronic utility meter. A printed wiring board and a plurality of connectors are employed which cooperate to eliminate the need to solder wires to the base and printed wiring board. All components are selected so that each respective component may fit into pin connectors and socket connectors which are, in turn, mechanically snapped to the printed wiring board. Snap together housings are employed which eliminate the need for screws, bolts, and glue to hold sub-components to the printed wiring board, and which hold the housings together. Finally, current sensors are employed which are in electrical communication with the printed wiring board without the use of soldering, screws, and bolts, and which are secured to the housings without the use of solder screws and bolt.

BRIEF DESCRIPTION OF THE DRAWING

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

FIG. 8 is an illustration of one embodiment of the electronic utility meter external housing.

FIG. 9 is an schematic block diagram of a second order infinite impulse response transfer function of the present invention.

DETAILED DESCRIPTION OF THE INVENTION

Figure 1:
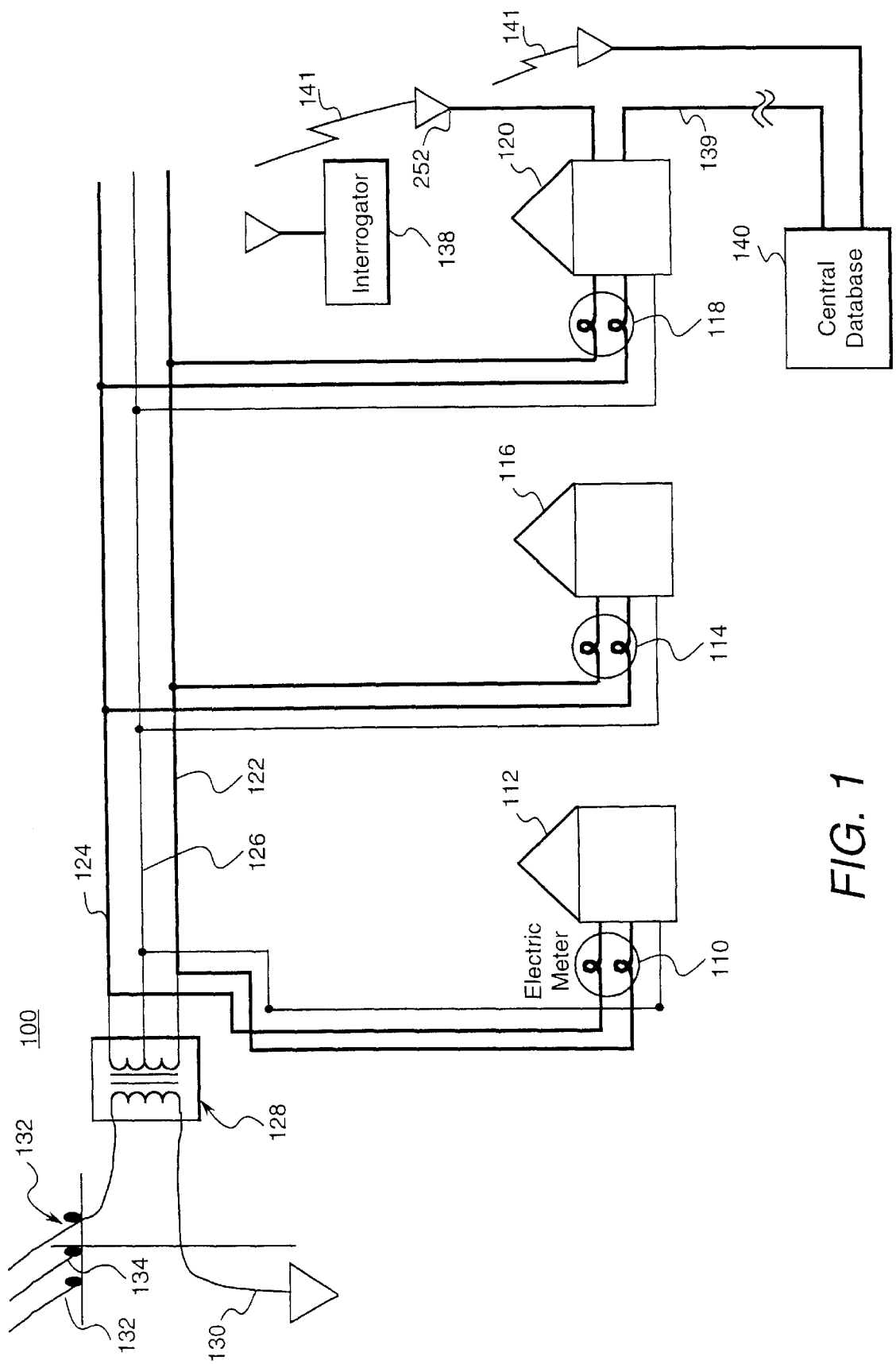
FIG. 1 is an illustration of a power line local area network in the present invention.

An electronic utility meter communication system 100 is described wherein all of the utility meters on the secondary side of a distribution transformer 128 have the ability to communicate with one another via a power line communication system within a "local area network," as is illustrated in FIG. 1. Reference to a "local area network" in this specification identifies a set of utility meters having the capability of communicating with one another by way of power line cables. For example, power line cable 124 forms a "local area network" communications path between dwellings 112, 116, and 120. Power line cable 124 thus forms the "local area network" communication path, in principal, because power line cable 124 cable has a common electrical path at each dwelling 112, 116 and 120. Correspondingly, power line cables 122 and 126 are likewise in electrical communion at each house 112, 116, and 120, so as to form a "local area network" communications path. Power line cables 122, 124, and 126 are also each coupled to the secondary side of a distribution transformer 128. Distribution transformer 128 is in electrical communication with a high voltage power line 132, where high voltage power line 132 is typically about 4,000 volts alternating current (VAC). Distribution transformer 128 is also coupled to a ground potential via power line transformer ground 130. Power line cable 126 is the power line neutral. All electronic utility meters of the present invention within the "local area network" have the capability of communicating with one another over power line cables 122, 124, or 126 because each power line cables 122, 124, and 126 is in electrical communication with each dwelling within the local area network. In the United States, distribution transformer 128 is, typically, in electrical communication with two to ten single family dwellings.

Modular "Soft-Key" Function Selectivity

Figure 2:
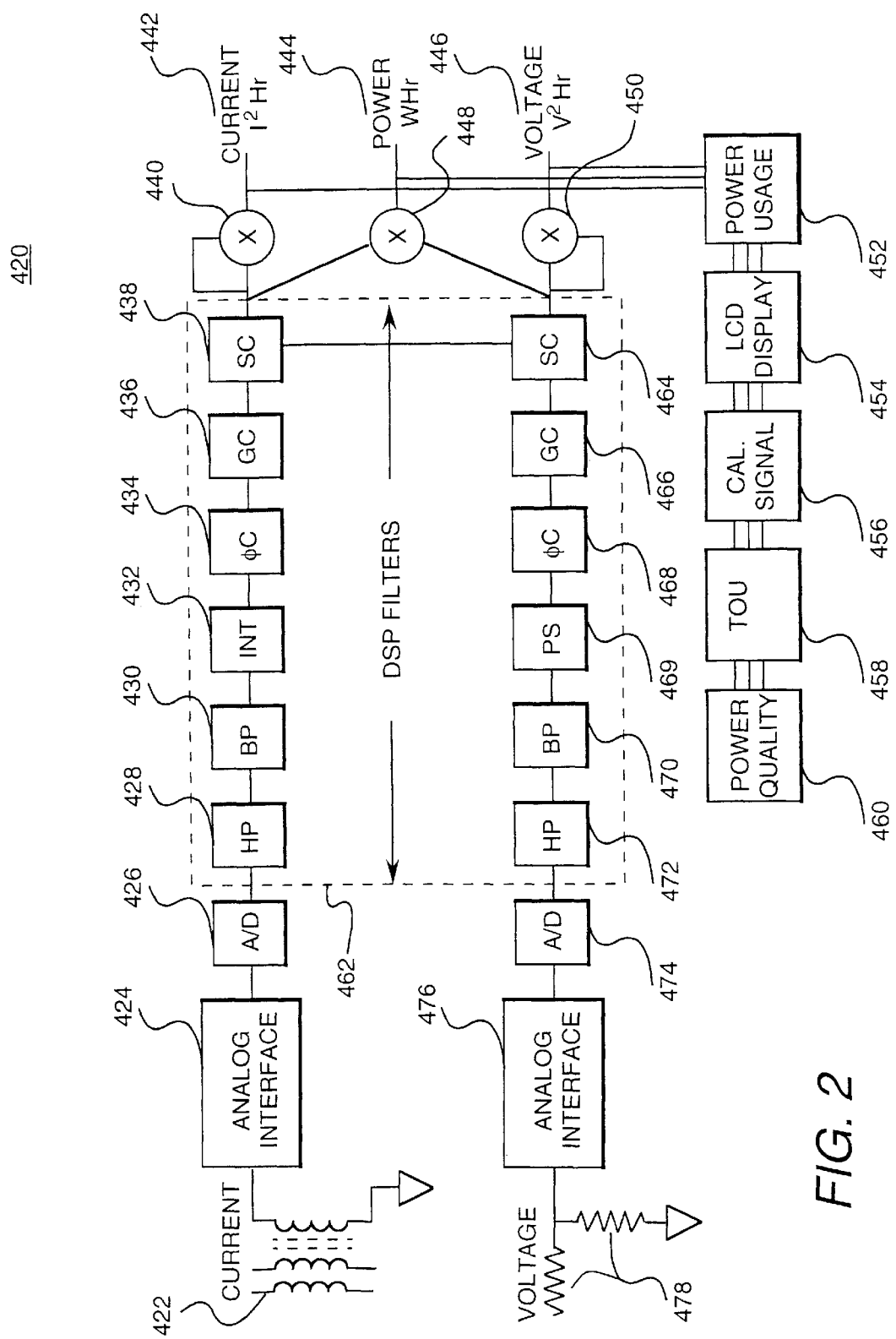
FIG. 2 is a schematic block diagram of modules which are interchangeable to reconfigure the electronic utility meter of the present invention.

The present invention enables a utility meter to selectively compute only those functions necessary to generate the utility measurement quantities desired by the utility company. These quantities may be reconfigured as desired by a user. The basic hardware 420, as illustrated in FIG. 2, comprises a current sensor 422, a voltage divider 478, a current analog interface circuit 424, a current analog to digital converter 426, a voltage interface circuit 476, a voltage analog to digital converter 474, and digital signal processor 462. Additionally, several support functions may be implemented which include a first power quality function 460, an liquid crystal display (LCD) 454, a calibration signal function 456, a time of use function 458, and a power usage function 452.

An electronic utility meter having re-configurable modules 420, as illustrated in FIG. 2, provides a low cost flexible electronic utility meter making use of a block-based functional-firmware architecture which provides for analog signal conditioning, (i.e. low pass, band pass, high pass, and all pass phase correction analog filtering) analog to digital conversion of the sensor signals, digital integration of the digitized current sensor signal, and functions of DSP (Digital Signal Processor) 462. Measuring utility usage with a block-based functional-firmware architecture allows; flexibility in implementation, flexibility in application, and expandability. This architecture enables, for example, the accurate elimination of noise, and accurate measurements of fundamental and harmonic content of: voltages, currents, real power, reactive power, and apparent power, magnitude and phase of voltage in a respective utility meter 110, 114, and 118.

DSP 462 includes the following functions, a current high pass block 428, a current band pass block 430, a current integrator block 432, a current phase corrector block 434, a current gain corrector block 436, a current sinc corrector block 438, a voltage high pass block 472, a voltage band pass block 470, a voltage phase corrector block 468, a voltage gain corrector block 466, a voltage sinc corrector block 464. Additionally, DSP 462 generates a current squared signal on current line 440, a power signal on power signal line 444, and a voltage squared signal on voltage signal line 446. DSP 462 also comprises functions which generate TOU (Time Of Use) measurements, demand measurements, power quality measurements, real energy measurements, reactive energy measurements, apparent power measurements, calibration and display functions, as shown in Power quality block 460, TOU block 458, Calibration signal block 456, LCD display block 454, and Power usage measurements block 452, all illustrated in FIG. 2. An optional phase shift block 469 is required in the voltage path only for reactive power measurements. Typically, phase shift block 469 generates minus 90 degrees of phase shift, and is only used when reactive energy measurements are made. When real energy measurements are made phase shift block 469 is not used.

The selection of the functions described above is made by the use of "soft-keys." Programming of the "Soft-keys" dictate the selection and scheduling of software functions within DSP 462. Programming of the soft keys may be accomplished by programming an Erasable Programmable Memory chip (EPROM). Alternatively, programming of the soft keys may be accomplished by the location of hard wire jumpers on a printed wiring board within the electronic utility meter 110. Alternatively, programming of the soft keys may be accomplished by programming an Electronically Erasable Programmable Memory chip (EEPROM).

By using "soft keys," different functional blocks are selected after the user defines a desired function. For example, if the user selects "soft key" for fundamental only real energy power metering, then current high pass block 428, current band pass block 430, current integrator block 432, current phase corrector block 434, current gain corrector block 436, current sinc corrector block 438, voltage high pass block 472, voltage band pass block 470, voltage phase corrector block 468, voltage gain corrector block 466, voltage sinc corrector block 464, Watt-hour multiplication block 448, and LCD block 454 are programmed into the software schedule, as illustrated in Table 1. Table 1 depicts the combination of functional blocks that are selected for any given utility meter requirement of the present invention. It is to be understood that the order of the blocks listed in Table 1 is not indicative of the order of operation of the software schedule.

TABLE 1

| Desired Measurement | IHP | IBP | IINT | IPC | IGC | ISC | VHP | VBP | VPS | VGC | VSC | $I^2$HRR | $V^2$HRR | WHRU | TOM | DEAL | CLCD |
|---|---|---|---|---|---|---|---|---|---|---|---|---|---|---|---|---|---|
| Real power | X | | X | X | X | X | X | | | X | X | X | | X | | | X |
| Reactive power | X | | X | X | X | X | | X | X | X | X | X | | X | | | X |
| Apparent power | X | | X | X | X | X | | | X | X | X | X | X | X | X | | X |
| Real power fundamental only | X | X | X | X | X | X | X | X | | X | X | X | | X | | | X |
| Reactive power fundamental only | X | X | X | X | X | X | X | X | X | X | X | X | | X | | | X |
| Apparent power fundamental only | X | X | X | X | X | X | X | X | | X | X | X | X | X | | | X |
| TOU | X | | X | X | X | X | X | | | X | X | X | X | X | X | X | X |
| DEMAND | X | | X | X | X | X | X | | | X | X | X | X | X | | X | X |
| CALIBRATE | X | X | X | X | X | X | X | X | X | X | X | X | X | X | | X | X |
| TOU fundamental only | X | X | X | X | X | X | X | X | | X | X | X | X | X | X | X | X |
| DEMAND fundamental only | X | X | X | X | X | X | X | X | | X | X | X | X | X | | X | X |
| Power quality | X | | X | X | X | X | X | | X | X | X | X | X | X | X | | X |
| Power quality fundamental only | X | X | X | X | X | X | X | X | X | X | X | X | X | X | X | | X |

Power Quality block 460 provides several alternative sub functions including, sags, swells, surges, harmonic content, and power outage information. The technique of adapting the metering functions to suit varying metering needs allows a power utility to monitor different line and load conditions as needs change. LCD display block 454 is adapted to display power usage in two ways including the continuous display of alpha-numeric data or binary enunciation of the rate of energy consumption.

The analog interface functions include: low pass filtering tailoring the high frequency behavior of the meter and the resonance of the sensor, bandpass filtering, and similar analog signal conditioning functions, electrostatic discharge protection by use of a low frequency pass filter, and a serial metal oxide varistor or a transient voltage suppresser diode. The above circuit also provides over-voltage and overload protection as well as reduces electromagnetic interference and electromagnetic susceptibility by use of the low pass filtering function included.

Sinc corrector blocks 438 and 464 are required to correct for gain roll-off associated with over sampled delta-sigma analog to digital blocks 426 and 474. When non-over sampled analog to digital blocks 426 and 474 are used, sinc corrector blocks 438 and 464 are not used. Typically, over sampled delta-sigma analog to digital converters include dither to improve low amplitude signal performance of the analog to digital converter. Alternatively, analog interface circuitry 424 and 476 include dither to compensate for the analog to digital converters which do not include dither.

Electric Meter with Firmware Configurable Communications Protocols

This invention comprises the construction of an utility meter which employs a central processor (microprocessor, micro-controllers, digital signal processor, etc.) to implement metering functions as well as external communications capability. While the metering functions remain largely constant among different implementations, the processor firmware is altered to allow the meter to communicate with external devices using a variety of protocols.

This invention enables the production of low cost, communicating electronic utility meters by enabling basic metering hardware and software to remain constant while enabling flexibility among various communications protocols. This is accomplished by implementing the communication protocol in a firmware or software module and using generic input and output (I/O) from the processor to control communications hardware. The communications firmware module functions just as the "soft-key" selectable software functions as described above. Typically, any communication modality requires some type of control function which is normally implemented by a dedicated processor. By combining the functions of the metering CPU and the communications control processor into a single processor cost is further reduced.

Figure 3:
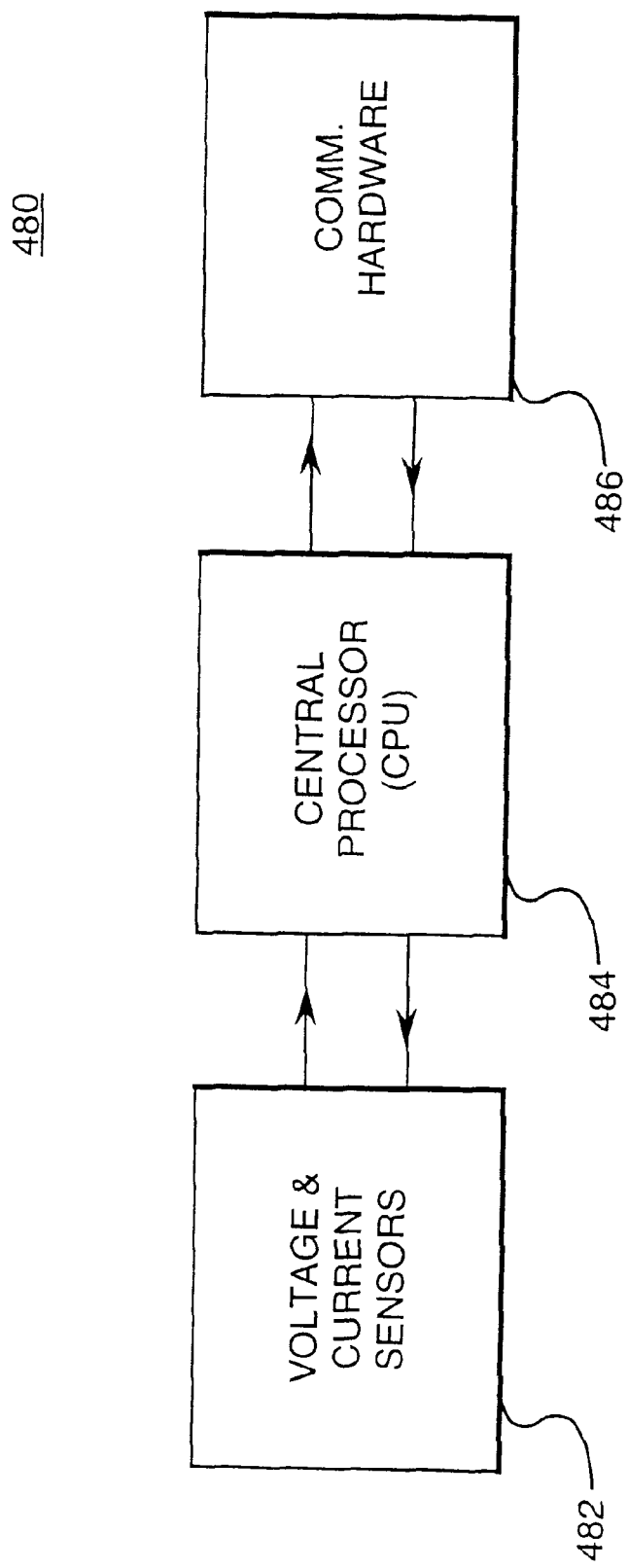
FIG. 3 is a schematic block diagram of the modular approach to firmware configurable communications capability of the present invention.

FIG. 3 illustrates a block diagram of the electronic utility meter architecture of the present invention. A single central processor 484 handles all the numeric functions related to metering as well as implementing the communications protocol and controlling the communications hardware 486.

In one embodiment of this invention, communications hardware 486 comprises at least one A/D converter interfacing a 900 MHz receiver (not shown) to CPU 484, and at least one D/A converter (not shown) interfacing CPU 484 to a 900 MHz transmitter (not shown). CPU 484 operates the transmitter and receiver by means of the A/D and D/A converters according to firmware selected by the user through "soft-keys." For example, one firmware selection enables the meter to transmit and receive according to an ITRON™ protocol and another selection enables the meter to transmit and receive according to a CELLNET™ protocol.

In another embodiment, rather than wireless hardware, meter 110 is equipped with a serial port for communication to an external device. The serial port transmit and receive data lines are also connected to infrared transmitter and receiver diodes which utilize an IRDA protocol.

As an example, a use may through "soft-keys" selection cause meter 110 to communicate with the external device via a standard hardware serial line, via an standard optical IRDA port, via a standard radio frequency protocol, or via a power line carrier protocol.

Software is written in a modular form such that replacing or switching the code implementing communications functions has no impact on the metering functions. The software is included in CPU 484 in the form of mask programmable ROM at fabrication time, and alternatively it is disposed in a memory mapped location in communications hardware 486. In the mask programmable ROM approach, a lower cost solution is achieved than in the memory mapped approach because fewer component parts are used. In the latter case, a more flexible solution is achieved as communications hardware 486 and communications software is modularized.

Digital Integrator for Electronic Utility Meter

In electronic utility meter 110 where digital integration needs to be performed, such as, electronic meters with air core current sensors, care must be exercised to avoid overflowing the integrator with DC signals. A digital integration technique insensitive to DC signals is developed, as part of a DSP based approach.

The air core based sensor does not generate voltage having a DC component, and the sensor is insensitive to DC currents. There, however, will be DC offsets or noise introduced into the sensor signal by the analog interface electronics 424, analog to digital conversion 426, as well as by finite precision truncation in any blocks within DSP 462, prior to digital integrator block 432. By using an IIR (Infinite Impulse Response) second-order filter with a transfer function as shown in equation 1, $$H(z) = \frac{c(z^2 - 1)}{(z - k)^2} \quad \text{equation 1}$$

a digital approximation to an analog integrator can be obtained which is immune to any DC signal or DC noise present in its input signal. In equation 1, H(z) represents the frequent response of the filter, "z" is a 30 sampled time frequency variable, "c" is a normalization gain constant of the filter, and "k" is the location of the low frequency pole pair. By choosing a value of "k" appropriately close to 1, an integrator function can be approximated over a desired bandwidth. The numerator of equation 1 places zeroes at $f_{s/2}$ (z=−1) and DC (z=1) where $f_s$ is the signal sample rate.

$$H(z) \frac{c(z^2 - 1)}{(z - k)^2} = \frac{c(z^2 - 1)}{z^2 - 2kz + k^2} \approx \frac{c(z^2 - 1)}{z^2 - 2kz + \hat{k}^2} \quad \text{equation 2}$$

In a digital filter implementation of equation 2, for example, an appropriate value of "k" may be $k=1-2^{-10}$.

While "2k" is straight forward to implement, in this example, i.e., $2k=2-2^{-9}$, $k^2$ would be a less convenient at:

$$k^2 = (1-2^{-10})^2 = 1-2^{-9}+2^{-20} \quad \text{equation 3}$$

An approximation is shown in equation 2, which makes implementation much easier, i.e., $$k^2 \approx \hat{k}^2 = 1 - 2^{-9} \qquad \text{equation 4}$$

For values of "k" sufficiently close to 1, the pole pair locations are altered slightly off the real axis and again a sufficient approximation of an analog integrator is obtained for some bandwidth. One implementation of this filter is shown in FIG. 9. IIR filter 325 comprises: a normalization gain amplifier 329; unit delays 351, 353, 337, and 345; summers 333, 335, and 341; unity gain 331, negative unity gain 349, "2k" gain amplifier 343, and "$\hat{k}^2$" gain amplifier 347.

By placing the pole pair very near the zero located at z=1, cancellation of one of the poles with the zero at DC occurs so that the overall transfer function approximates that of an integrator for frequencies significantly away from DC. Also, insensitivity to DC at the integrator input is maintained due to the zero placed directly at DC(Z=1).

LCD Driver

This invention provides a low cost circuit that utilizes a microprocessor or digital signal processor to drive LCD segments.

Figure 4:
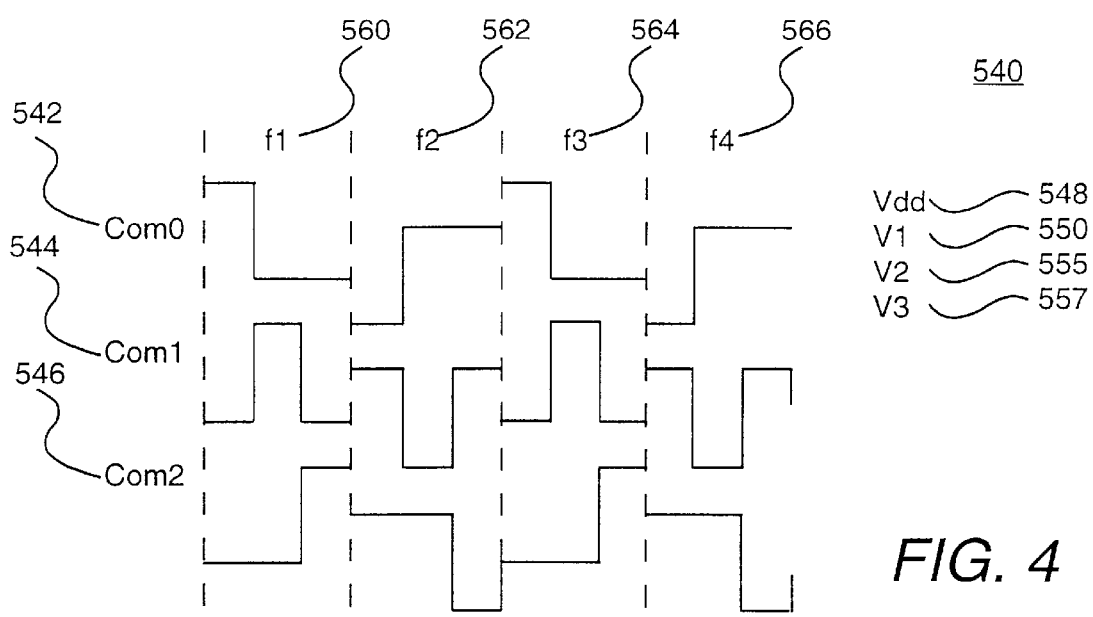
FIG. 4 is a graphical illustration of the voltage levels of an liquid crystal display driver circuit applied to an liquid crystal display of the present invention.
Figure 5:
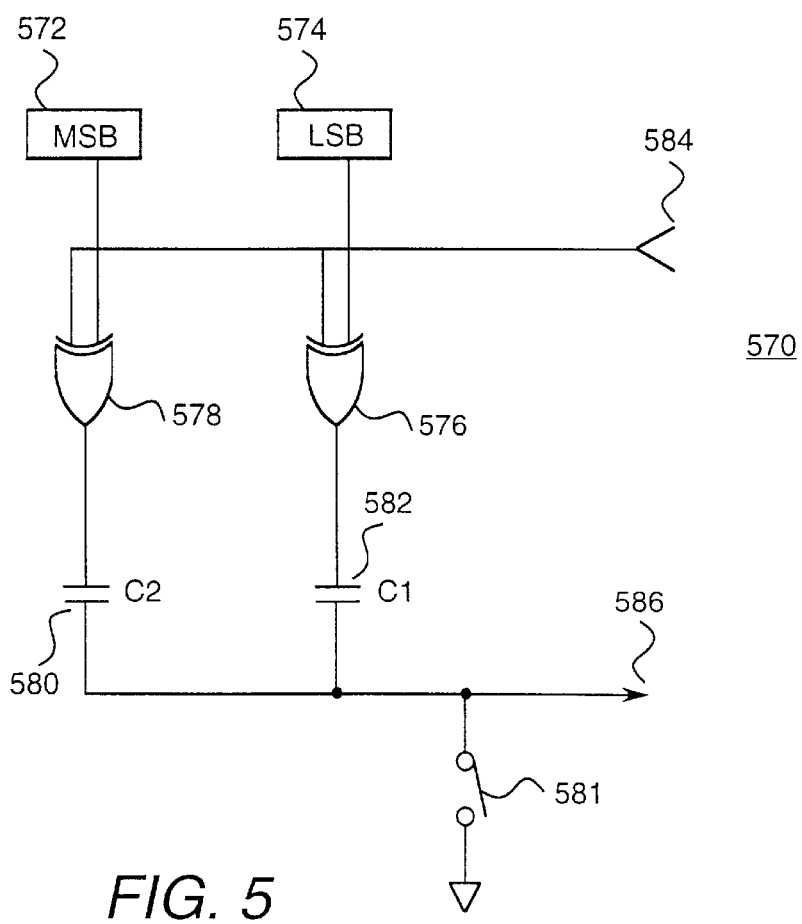
FIG. 5 is a schematic illustration of the logic employed to control the voltage levels of the liquid crystal display driver illustrated in FIG. 4.

A multiplexed LCD driver 570 comprising EXCLUSIVE OR (XOR) gates 572 and 574 and voltage level capacitors 580 and 582 is illustrated in FIG. 5, and is adapted to generate analog waveforms 548, 550, 555, and 557, as graphically illustrated in FIG. 4. These analog waveforms are compatible with typical waveforms required to drive a multiplexed Liquid Crystal Display (LCD) 144 (FIG. 8). Multilevel signals are produced by arranging voltage level capacitors 580 and 582 so that discrete analog voltage levels are produced when binary signals are applied to a most significant bit (MSB) line 572 and a least significant bit (LSB) line 574 of LCD driver 570. An inverter line 584 is coupled to XOR gates 576 and 578. When the state of inverter line 584 is reversed the waveform generated by LCD driver 570 is inverted, as is illustrated by the values in Table 2. LCD driver 570 generates a LCD drive signal on drive signal line 586 to drive one segment of an LCD without the use of voltage multipliers or resistive divider networks. LCD driver 570 may be interfaced with a digital signal processor (DSP) or other microprocessor (not shown). It is to be understood that a plurality of LCD drivers 570 are required to drive multiple segments of LCD display 144 (FIG. 8) and is within the scope of this invention.

TABLE 2

| Invert line 584 | LSB line 574 | MSB line 572 | LCD drive voltage |
| --- | --- | --- | --- |
| 0 | 0 | 0 | (V3) 557 |
| 0 | 0 | 1 | (V1) 550 |
| 0 | 1 | 0 | (V2) 555 |
| 0 | 1 | 1 | (Vdd) 548 |
| 1 | 0 | 0 | (Vdd) 548 |
| 1 | 0 | 1 | (V2) 555 |
| 1 | 1 | 0 | (V1) 550 |
| 1 | 1 | 1 | (V3) 557 |

Liquid Crystal Displays, due to the high number of segments which must be driven, typically employ multiplexing to reduce the number of lines required to drive the display. Typically a number of "common" (also called "back-plane", or "scan") lines are connected to one side of the display segments while "segment" lines are connected to the opposite display segment die. The opacity of a given segment is determined by the rms voltage applied to the segment. The rms voltage applied to the segment is determined by the waveforms applied to the common line and segment lines. Because any DC voltage applied to an LCD segment can cause the LCD segment to degrade over time as a result of electrolysis, it is desirable to provide an rms voltage that alternate in polarity between frames so that the average voltage applied to a segment is zero volts. LCD driver 570 generates an rms voltage which has an average voltage of zero.

For example FIG. 4 illustrates one set of rms LCD drive voltage waveforms which are generated by LCD driver 570 to control an LCD segment of LCD 144 (FIG. 8). Again, by way of example, LCD driver 570 provides three to one multiplexing and generates four different analog voltage levels on LCD drive line 586. The four analog voltage levels may also be expressed as binary values of "00", "01", "10" and "11". In this example since binary values are assigned to voltage levels in ascending order, as described above, the voltage levels generated during frame one (f1) are inverted to obtain the values output in the next frame (f2), thus producing a rms voltage waveform with a DC value of Vdd/2 as illustrated in FIG. 4. Frame three (f3) and frame four (f4) are likewise complementary. Each respective waveform 548, 550, 555, and 557, is generated so as to contain an equivalent DC value such that the DC difference between an LCD segment ground or common line and drive line is zero.

The voltage levels shown in FIG. 4 are equally spaced between zero volts 557 (V3) and maximum voltage level 548 (Vdd). To generate these discrete voltage levels, a binary value may be stored in a random access memory (RAM) location, which may be mapped into the memory space of a DSP or microprocessor. Because waveforms 548, 550, 555, and 557 are repetitive, successive binary values used to generate these waveforms may be stored in adjacent locations in RAM which can be easily cycled through.

With this configuration, charge is summed at LCD driver line 586 generates a voltage level which is proportional to the capacitance of voltage level capacitors 580 and 582. If the capacitance of voltage level capacitor 580 is equal to twice the capacitance of voltage level capacitor 582, then the contribution from MSB line 572 will be twice the contribution of the signal from LSB line 574. In this manner the LCD driver voltage level is proportional to the binary value stored in the RAM. The driver voltage signal from driver voltage line 586 may be coupled to the LCD segment common line and drive lines by a operational amplifier.

The output signal will provide four equally spaced voltage levels 548 (Vdd), 550 (V1), 555 (V2), and 557 (V3). Leakage current at LCD driver line 586 may cause an offset of Vdd/2 in the LCD drive signal. This bias level is accepted because the absolute driver voltage level is not critical to the operation of the LCD segment.

Alternately, a discharge switch 581 may be coupled from the driver signal line 586 to ground. Discharge may be selectively activated to switch 581 grounds driver signal line 586, forcing the driver voltage to zero each time a "00" value is applied to MSB 572 and LSB 574.

Although the LCD driver 570 described herein is adapted to generate a rms voltage waveform having four discrete levels it is to be understood that by adding additional XOR gates and voltage level capacitors the number of discrete voltage levels generated by LCD driver 570 may be increased. The number of discrete voltage levels is directly proportional to the number of bits coupled to LCD driver 570 according to the relationship "number of voltage levels= $2^{(number\ of\ bits)}$." Additionally, voltage levels 448, 450, 455, and 457 need not be evenly distributed and can be changed by selecting a capacitance value of voltage level capacitor 580 that is not twice the capacitance value of capacitor 582.

Utility Meter Power-Down Sequence

This invention provides methods for power-off sequences in utility meter 110 (FIG. 1). These power-off sequences conserve power stored in the power supply's storage capacitor (not shown) allowing central processor 484 (FIG. 3) to save critical information in non-volatile memory before shutting down completely. These power-down methods reduce the cost of utility meter 110 while allowing improved performance as described below.

Electrically re-writable non-volatile memory devices such as FLASH memory, which is used to save operating parameters in the event of a loss of power, have a limited number of write cycles during the device lifetime. As an example, MICROCHIP 93C86™ serial EEPROM is rated at 10,000,000 erase/write cycles. Hence, the program written to save data to non-volatile memory must be conservative in its decisions to write to this memory so as not to shorten the operating life of the electric meter. The program implements functions in a progressive manner, taking steps to first conserve power, then finally writing to non-volatile memory when it would appear that restoration of power is not imminently likely.

When power to the meter does fail it is important to have enough energy stored in the meter's own power supply to allow the meter to power-down in a predictable manner. Adding energy storage to the power supply by increasing the size of the storage capacitor in the supply is costly, and hence, undesirable.

In the present invention a power down process is implemented in utility meter 110 to take various appropriate actions as a result of power supply voltage drops or outages that pose a threat to continued operation of utility meter 110, as discussed below. After a voltage drop is detected within utility meter 110 the microprocessor stores important information, such as accumulated kilowatt-hours, to non-volatile memory so that this data will not be lost during the power outage, according to the process illustrated in FIG. 6. The utility meter voltage is defined as the line-to-line voltage across power line phase one 122 and power line phase two 124 (FIG. 1).

Figure 6:
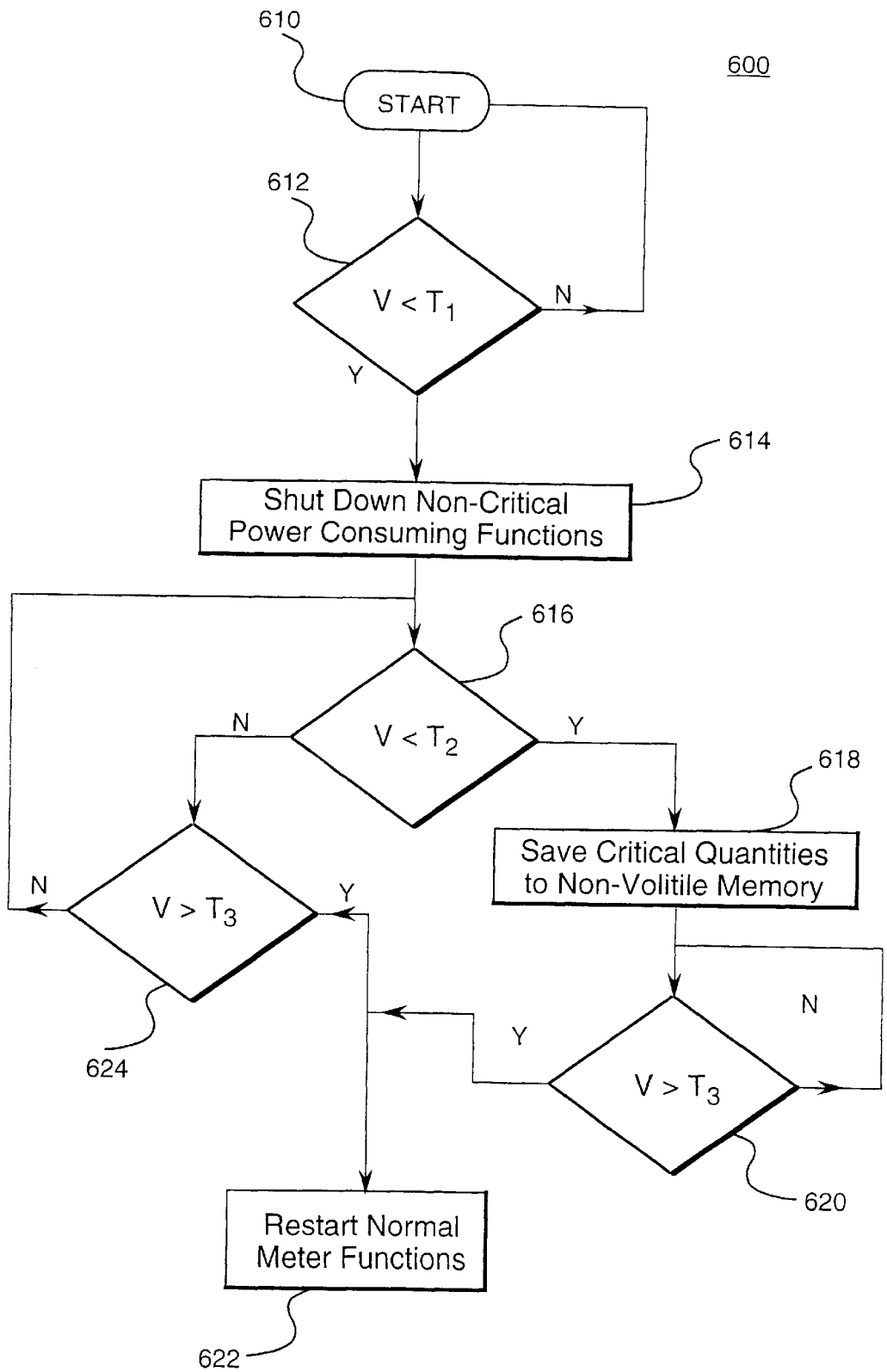
FIG. 6 is a process flow block diagram of the power down sequence of the present invention.

First, the utility meter voltage is monitored, when the utility meter voltage is not greater than a first threshold power is removed from non-critical functions, as illustrated in the process of FIG. 6, steps 612 and 614. Non-critical functions include LCD display 144 (FIG. 8), communications circuitry 486, and LCD driver 570 (FIG. 5). Exactly which functions are deemed non-critical are determined by the specific design of the utility meter, the functions included in the meter, and the meter's intended function. The first voltage threshold is defined as that voltage level which causes utility meter 110 to lose some power but yet be functional. An example of a typical value for the first threshold in a 110 vac residential electric meter application would be 90 vac.

Next, if the utility meter voltage drops below a second threshold less than the first threshold save critical values in non-volatile memory, as illustrated in the process step 616. The second threshold is defined as the utility meter voltage level below which the utility meter fails to operate. Critical values include but are not limited to computer memory pointers, accumulated kilowatt-hours, utility meter voltage readings, and utility meter current readings. An example of a typical value for the second threshold in a 110 vac residential electric meter application would be 80 vac.

Next, if the utility meter voltage is not greater than a third threshold take no action, as illustrated by the process of step 620. Alternatively, if the utility meter voltage is not greater than a third threshold and not greater than the second threshold take no action, as illustrated in process steps 616 and 624. The third threshold is defined as the utility meter voltage level at which normal utility meter operation is possible. An example of a typical value for the third threshold in a 110 vac residential electric meter application would be 100 vac.

Finally, if the utility meter voltage is greater than the third threshold restore all utility meter functions, as illustrated in the process steps 620 and 622.

In another embodiment of this invention, rather than examining the voltage level presented to the meter, a "power-out" indicator generated by the meter CPU could also be used to make power-down decisions. This allows more logic and reasoning to be inserted into the power down process. In this embodiment, the meter may be powered down due to power quality reasons rather than simply power outage.

In an alternative embodiment of the present power down process, as indicated in Table 3 the use of 60 Hertz voltage cycle would, for example, provide the timing intervals for the following power-down sequence when the utility meter voltage is below the above described second threshold.

TABLE 3

| Outage Duration | Action Taken by CPU |
| --- | --- |
| 1 cycle | * Power down display unit |
|  | * Power down external communication hardware |
|  | * Terminate all external I/O |
| 4 cycles | * Write to non-volatile memory |
| 6 cycles | * No action (Power is exhausted) |

To ensure that power is conserved, when power conservation actions are taken by the processor a heuristic process may be desired to add some hysteresis to the measurement of the power supply voltage. Hence, if a voltage cycle is missed and power conservation actions are taken, a predetermined time, or delay, must elapse before the meter would be stored to its fully operational state. This delay prevents an extraneous cycle from causing power consuming hardware to be turned back on. The length of this delay would be determined by the design of the power supply and the power consumption of the meter in the various states of power-down. It is understood that a timer may be used rather than the 60 Hertz cycle upon which actions are take as described above. It is also understood that if the number of cycles in which power is exhausted is greater than or less than 6 cycles, the delay before which the above described actions are take may be extended or contracted as appropriate.

Apparatus for Assembly of a Low Cost Communicating Electricity Meter

This invention is an apparatus for electronic communicating electricity meter 110 which minimizes expensive soldered electrical connectors and time consuming assembly. This invention is also a apparatus for wiring electromagnetically sensitive signal carrying conductors. This invention also provides a apparatus for attaching the current sensor assembly that ensures final design dimensional stability while providing mechanical flexibility in meter socket insertion thus reducing socket and blade stress.

An important consideration in the simplification of assembly of communicating electricity meter 110 is in the integration of the communication, metering, and display functions on the same PWB (Printed Wiring Board). FIG. 8 illustrated a utility meter 110 having a housing 142 and a LCD display 144.

Figure 10:
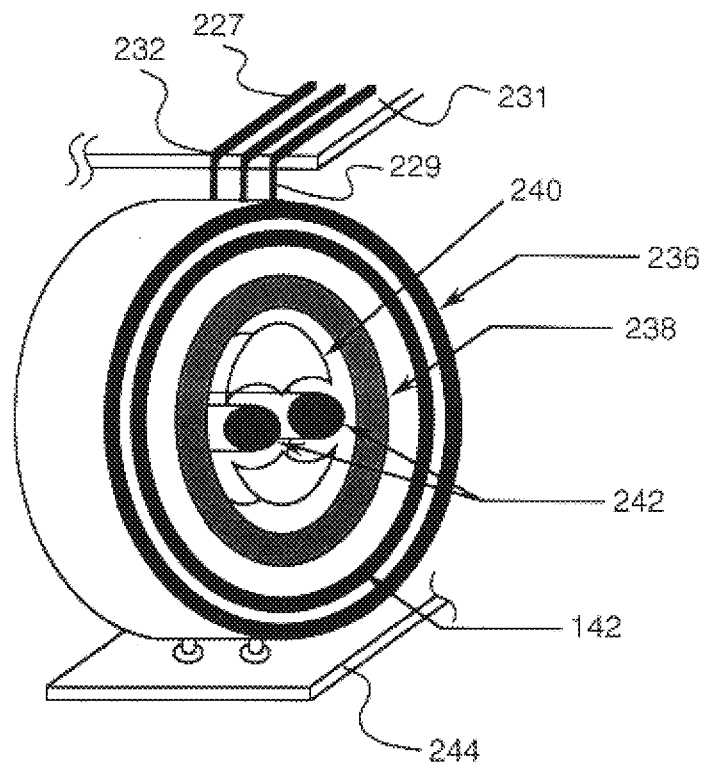
FIG. 10 is an illustration of the assembly of the utility meter base and the printed wiring board to a dual conductor current sensor of the present invention.
Figure 13:
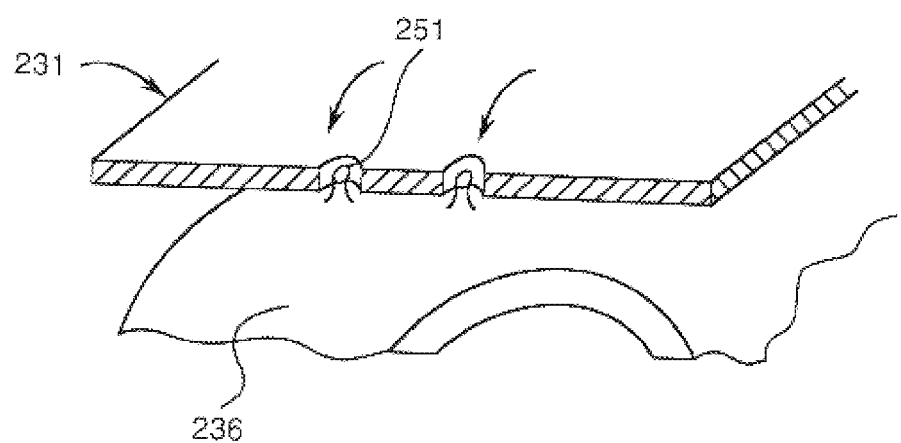
FIG. 13 is an illustration of the apparatus for assembly of the magnetic shield of the current sensor to the printed wiring board of the present invention.

Pin and socket type connections are used, with the aid of an appropriate fixture for temporary alignment, to align and connect a base 244, current sensor shield 236, and PWB 231, as shown in FIGS. 10 and 13. The current sensor is enclosed in a magnetic shield 236 that has some registration parts that are snapped to base 244 by using tabs 251 on shield 236, and the matching parts 250 on base 244. In one embodiment this registration part is a cut in the housing that engages with a pin the base. In an alternate embodiment a cutout exists in base 244 into which a location pin in housing 140 is inserted. Similarly, a set of registration parts on PWB 231 are used to snap PWB 231 with respect to the sensor and at the same time use the pin and socket type connectors 248 to electrically connect the sensor to the circuitry on PWB 231, as shown in FIG. 11.

The use of pin and socket type connectors 248 are integrated into prefabricated plastic molded housings that are snapped together during assembly. These assemblies also hold PWB 231, display 144, and current sensor shield 236. These components are then snapped to base 244, thus eliminating any screw connections. Disassembly can be done by simultaneous bending of the snap-pin(s) resulting in reduced disassembly time. In a alternative embodiment a single housing 140 is used. Housing 140 separated into two halves may also be used. If two housing halves are used, the upper housing holds display 144 and provides means for press coupling via an elastometric connector from display 144 to PWB 231. This upper half of housing 140 also provides the guides for pin connectors 229 from the current sensor and voltage bus bars 227 and holds PWB 231 in place. The lower half of housing 144 holds the current sensor and bus bars 227 in place and snap them to base 244. Both halves of housing 140 are then snapped together completing the electrical connections. These two housing halves are formed in such a way that the connection between PWB 231, pin connectors 229, and display 144 are rigid in nature, as well as the alignment of the current sensor and bus bars 227. However, the connection to base 244 is mechanically more flexible, allowing movement of the blade connectors attached to the bus bars to accommodate socket variations. This is accomplished by using a reduced housing wall thickness or base connection area.

Figure 15:
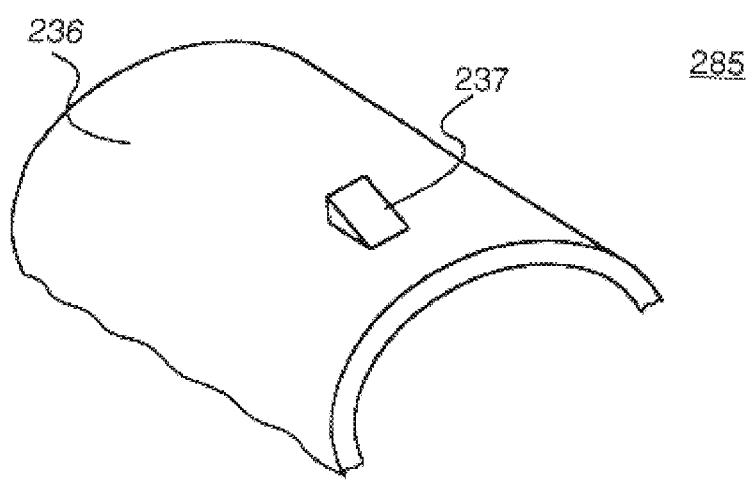
FIG. 15 is an illustration of a notch used for coupling the magnetic shield of the current sensor to the printed wiring board of the present invention.

In FIG. 10, PWB 231 is coupled to the sensor via a registry 234. In one embodiment, this registration is obtained by using protruding parts molded into the housing of the sensor with matching holes in PWB 231. FIG. 13 details registration parts 234. Registry parts 234 are also used for the registration of the sensor with respect to meter base 244. An alternate means of registration is obtained by using snapping ridge 237 on shield 236, as shown in FIG. 15. Also shown in FIG. 10 are fixtures 240 used to snap and hold the primary conductors 242 with respect to the shield 236.

Figure 11:
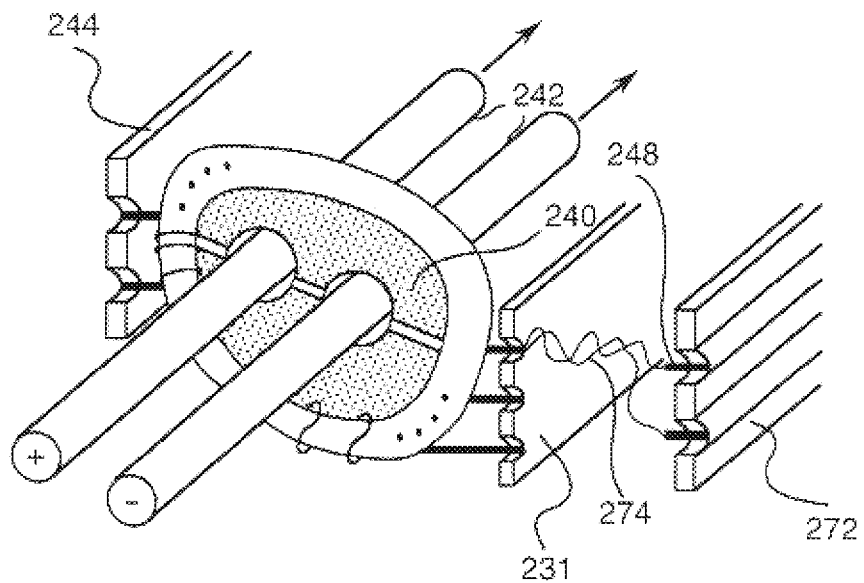
FIG. 11 is an illustration of a functional view of the assembly illustrated in FIG. 10.

FIG. 11 shows an exemplary connection for a PWB 272 and PWB 231. Another preferred connection is to use long pins or twisted pair wires 274 extended between PWB 231 and sensor shield 236.

Figure 12:
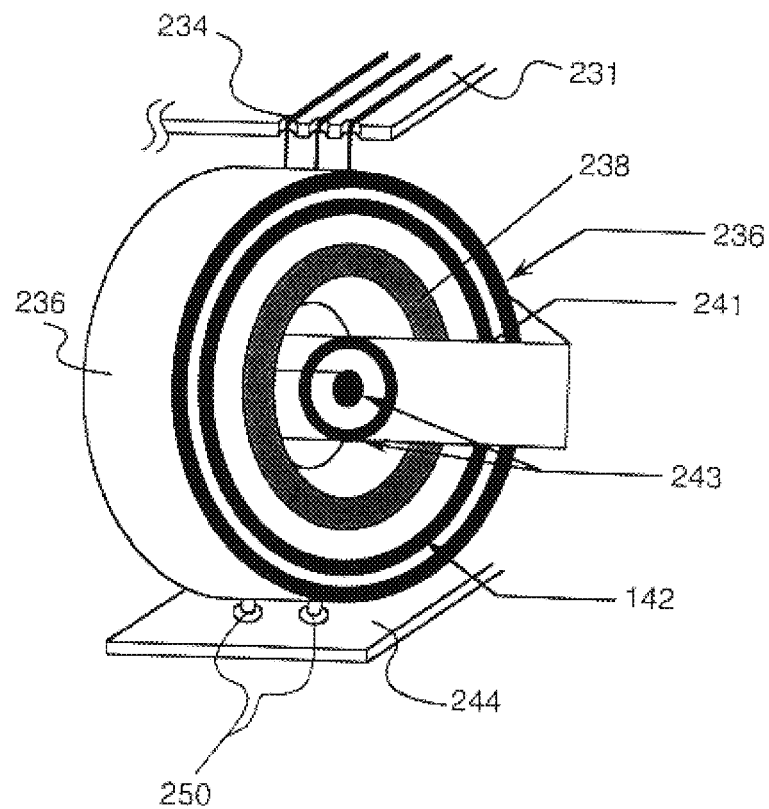
FIG. 12 is an illustration of the assembly of the utility meter base and the printed wiring board to a single conductor current sensor of the present invention.
Figure 14:
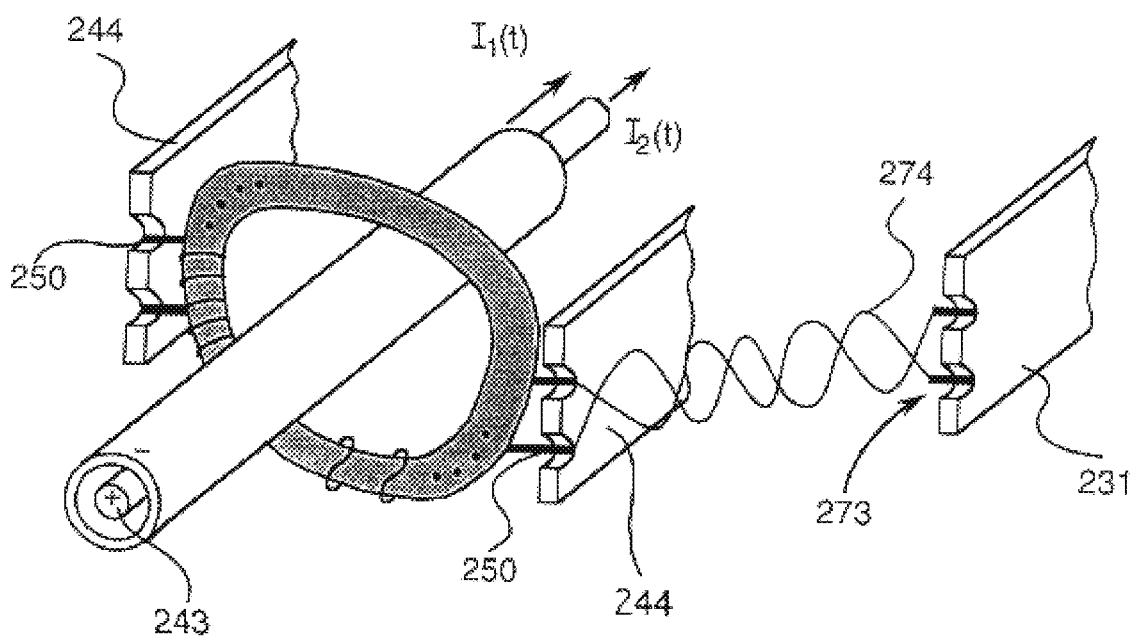
FIG. 14 is an illustration of a functional view of the assembly illustrated in FIG. 12.

FIGS. 12 and 14 illustrate a symmetrical primary conductor 243 configuration. Symmetrical primary conductor 243 is assembled in a substantially similar way as primary conductors 242 assembly except that a fixture 241 that holds and registers primary conductors 243 to the sensor shield 236 is arranged to hold conductors 243 concentrically with sensor shield 236.

When a single integrated housing 140 is used, the same principle described above applies but housing 140 houses the above described components. The connection pin guides are then incorporated into the housing. The assembly is comparable, but PWB 231 slides in between the guide pins and the top of housing 140.

Method of Calibrating a Low Cost Electronic Utility Meter

This invention details a efficient method of calibrating electronic residential meters, by allowing access to and making use of real-time acquisition of raw and processed sampled data (voltage and current) before it is typically multiplied and accumulated into the final energy quantity, and by using known meter performance data to determine the most optimal calibration point(s).

Figure 7:
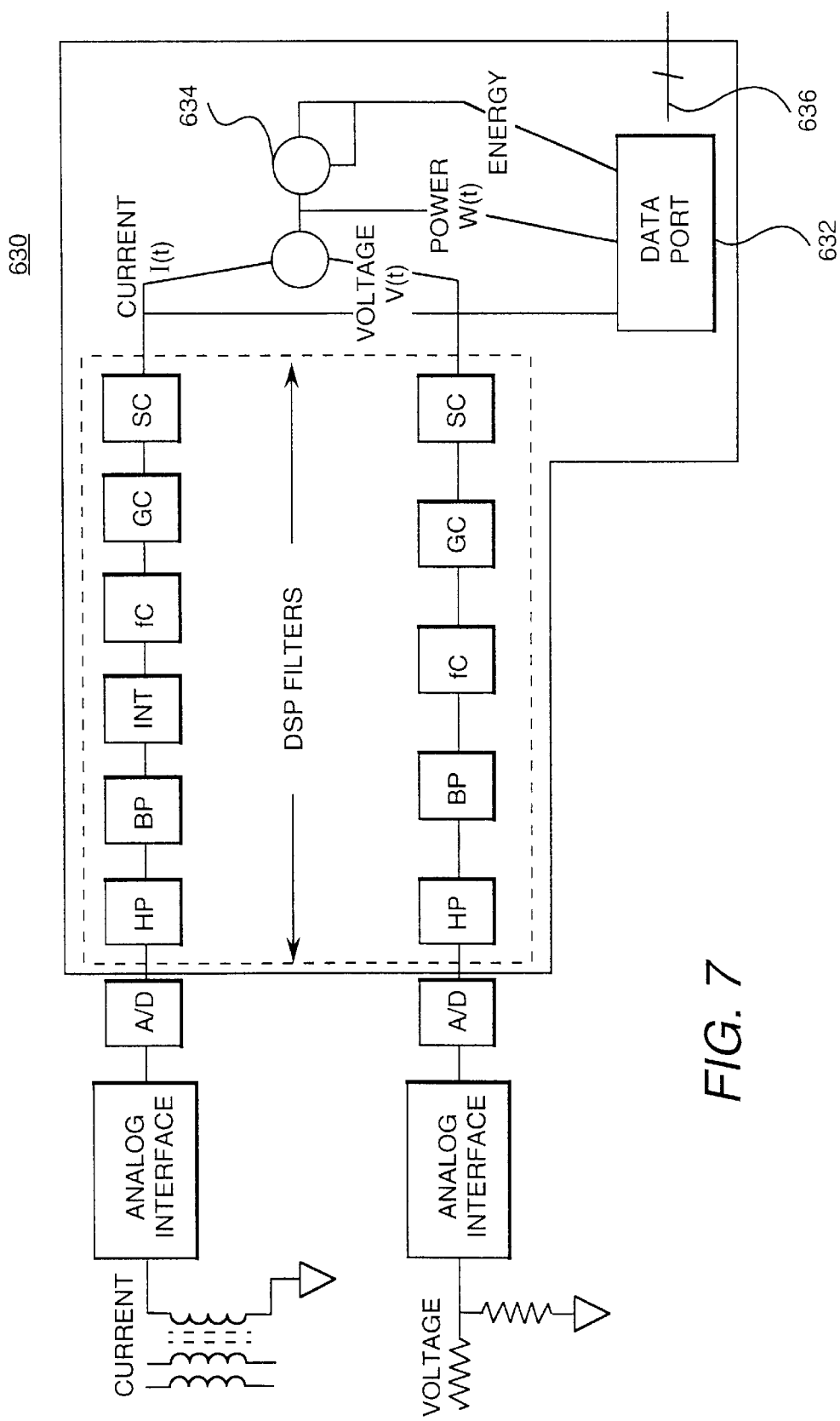
FIG. 7 is a schematic block diagram of the hardware for calibrating the electronic utility meter of the present invention.

A block diagram of electronic residential electricity meter 110 adapted to communicate with an external device is illustrated in FIGS. 7. Access to the raw and filtered instantaneous current samples, voltage samples, and power samples, as well as the integrated power samples is made using a data port 632 via a data port line 636. By using data port 632 to read the acquired samples, many samples are quickly acquired for use in the computation of calibration constants for both magnitude and phase adjustments for both channels. It is to be understood that in this specification power samples may also be represented by energy divided by a defined time unit.

Figure 16:
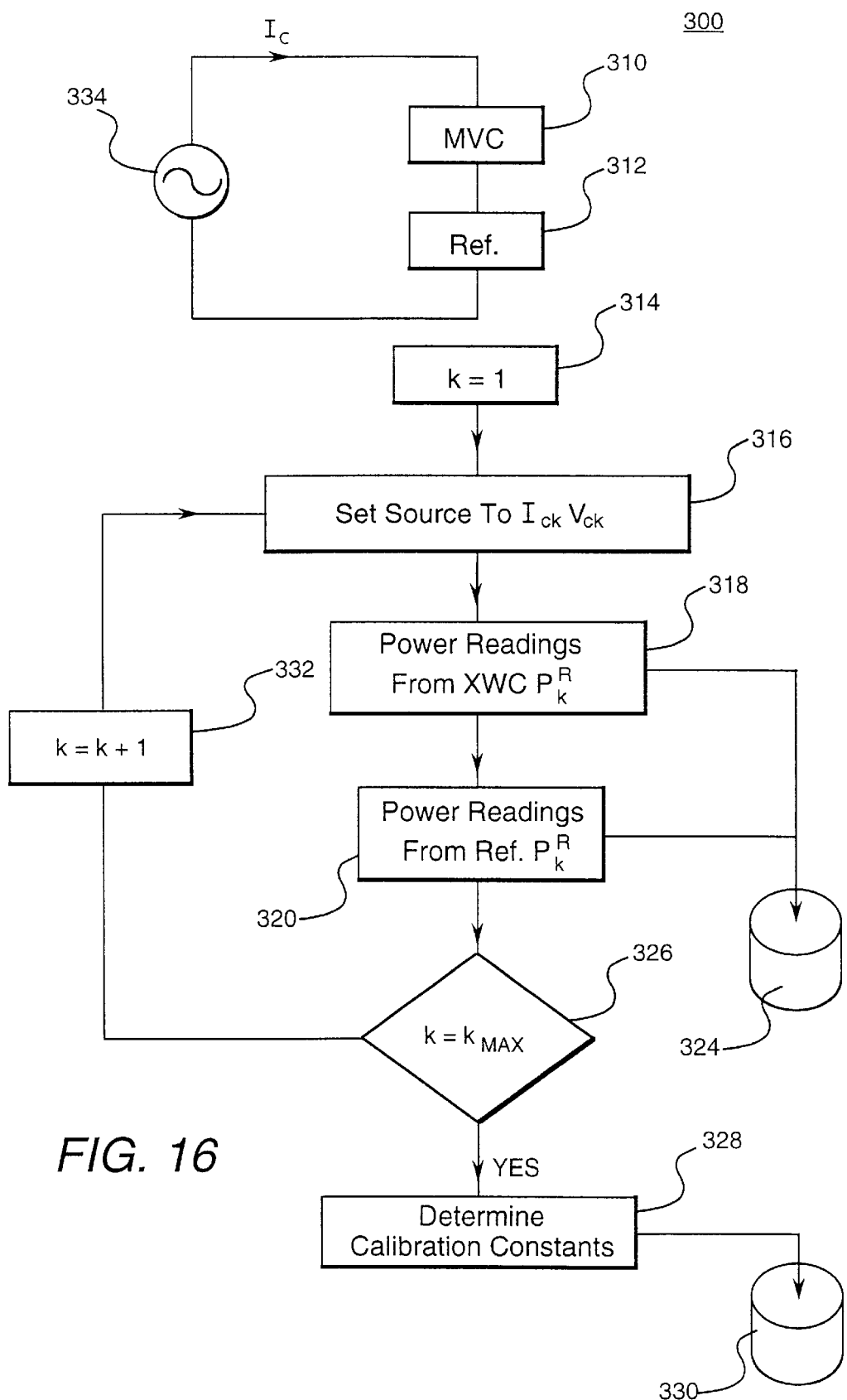
FIG. 16 is a process flow diagram indicating the method of determining calibration constants for the utility meter of the present invention.

In an exemplary embodiment, the integral data communication port 632 of communicating residential meter 110 is used to set meter 110 to a calibration mode by a calibration command supplied to the meter. Meter 110 is then supplied with a known precision voltage and precision current load having a known phase angle. The voltage and current, as well as the phase relationship between the two, is varied over a range of typically 180 Volts to 260 Volts and 1 Amp to 240 Amps for phase differences of zero degree up to ninety degree both lagging and leading to cover a range of power measurement environments. A fixed number of these combinations are used as calibration points for the calibration of meter 110. For a five point polynomial correction system, the calibration points used are illustrated in Table 4. The voltages and currents provided by the calibration unit are of known and accurate value and traceable to national standards. The process steps utilized to determine calibration constants are shown in the process flow diagram in FIG. 16. In this flow diagram the meter to be calibrated is entitled the meter under calibration (MUC) (step 310). A precision voltage and current source is coupled to the MUC and coupled to a reference meter as shown in steps 334 and 312. Next, the voltage and current source is set to known values (step 316), power readings of the MUC and reference are taken and stored (steps 318, 320, and 324). Then steps 316 to 324 are repeated until the desired number of samples are stored. Finally, the calibration constants are calculated and stored (step 328 and 330).

TABLE 4

| Parameter | Value |
| --- | --- |
| $I_c$ = 3 Amps, PF = 1 | $C_1$ |
| $I_c$ = 30 Amps, PF = 1 | $C_2$ |
| $I_c$ = 3 Amps, PF = ½ | $C_3$ |
| $I_c$ = 30 Amps, PF = ½ | $C_4$ |
| $I_c$ = 60 Amps, PF = 1 | $C_5$ |

In an alternate calibration method, a physical connection is made to the electronic meter 110 via data port 632 (FIG. 7) to an external calibration system (not shown). Calibration data is computed and then written into the non-volatile memory within electronic meter 110.

In both cases above, access to the calibration software is controlled by use of a security access code to prevent data tampering.

The computed calibration constants for the magnitude and phase are used to program the filters in DSP 462. "N" separate calibration points are used to define the quantitative behavior of the meter. In this specification "N" is defined as the total number of calibration data points. "N" is typically chosen to be at least equal to or larger than 2 to insure that the calibration is based on the values of the current where there are accuracy requirements. Although the method of calibration mentioned herein would work with the single-point calibration (using "N"=1), "N">=2 is preferred for the reasons discussed below.

Typical meter calibration involves taking multiple readings at various test conditions, such as full load (30 Amps at a power factor (PF)=1), light load (3 Amps at a PF=1), and lag load (30 Amps at a PF=0.5). Each test consists of comparing the energy output value (integrated power) against a threshold value. When the threshold is exceeded a pulse is displayed on display 140 (FIG. 8). By acquiring and using multiple samples of voltage and current data, one shorter set of data need be taken and all necessary calibration quantities is then derived from that run set. Using table 4, meter 110 is exposed to the voltages and currents as expected under normal operation.

Any deviation from these known and predetermined values as measured by the un-calibrated meter are used to provide a correction approximation that is included in the power calculation algorithm. These corrections can account for non-linearities caused by the current sensor due to magnetic saturation for ferrite or other ferromagnetic materials where the B-H behavior deviates from a straight line at higher field values, correct for the effect of temperature dependence of the current sensor, and correct for the effect of physical change of the sensor location with respect to any shields and the main current carrying conductor causing a loss of symmetry due to high magnetic field forces.

To calibrate against an independent meter standard, samples are only acquired during a known interval of accumulated power as regulated by the external standard. In an alternate calibration method a DFT may be computed to determine both the magnitude and phase calibration constants. In an exemplary embodiment a Fourier Transform is performed using a Fast Fourier Transform algorithm (FFT) with 64 data points. In this case additional data points need to be established in the data collection phase of the calibration procedure. For higher accuracy additional data points are needed. These constants computed in the alternate calibration method are then stored in non-volatile memory for use in the normal calibrated operation of the meter. Once the data set has been acquired, a first meter may be released from the calibration setup while its data is being computed allowing a alternative meter to immediately take its place and start data acquisition. A separate station is then used to input the appropriate parameters and constants into the first meter. A simple identification scheme is used to identify the respective meter with the calibration information. This scheme relies on providing an optional unique serial number to each meter in turn and writing the data as part of the calibration data into the non-volatile memory of the meter.

By using the calibration table information about the meter (sensors, analog interface electronics, and DSP filters), calibration is no longer fixed to predefined test points, such as 3A and 30A, or to a predefined number of test points. If the meter performance or any component thereof is known to be of a certain characteristic shape (as graphed against some test condition, such as current or voltage), then optimal calibration schemes, such as the polynomial corrections, as disclosed above, rather than linear, and optimal calibration points may be chosen. Subsequent meter performance may be verified at the traditional test points, but calibration time may be significantly reduced and overall meter accuracy may be enhanced, by using this method of calibration. By use of a higher order, such as $5^{th}$ order, as shown above, polynomial calibration and subsequent correction, a smoother correction can be obtained than by use of a second order calibration scheme as traditionally applied, resulting in a higher accuracy meter function.

It will be apparent to those skilled in the art that, while the invention has been illustrated and described herein in accordance with the patent statutes, modifications and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A re-configurable utility meter, having a current signal and having a voltage signal, said utility meter comprising:
   a current sensor;
   a voltage sensor;
   a DSP coupled to said current sensor and coupled to said voltage sensor, said DSP programmable by soft keys for selection of functions, said DSP comprising:
      a high pass filter for filtering noise from the current sensor signal;
      a phase corrector coupled to said high pass filter, wherein said phase corrector is adapted to correct phase error in the current sensor signal;
      a gain corrector coupled to said phase corrector, wherein said gain corrector is adapted to correct for gain error in the current sensor signal; and
      a re-configurable power measurement block for computing real power, reactive power, or apparent power, based on said soft key selection.

2. The re-configurable utility meter as recited in claim 1, further comprising a Time of Use (TOU) function, wherein said TOU function may be selected to generate a plurality of signals indicative of energy usage over specified units of time.

3. The re-configurable utility meter as recited in claim 1, further comprising a demand function, wherein said demand function may be selected to generate a plurality of signals indicative of the rate of energy usage over specified units of time.

4. The re-configurable utility meter as recited in claim 1, further comprising an LCD display, wherein said LCD display may be selected to display power usage in two ways including the display of alpha-numeric data and binary enunciation of the rate of energy consumption.

5. The re-configurable utility meter as recited in claim 1, further comprising a calibration function, wherein said calibration function may be selected to generate at least one calibration signal.

6. The re-configurable utility meter as recited in claim 1, wherein said current sensor comprises a differentiating current sensor.

7. The re-configurable utility meter as recited in claim 6, wherein said DSP further comprises an integrator coupled to said high pass filter, wherein said integrator is adapted to integrate the current sensor signal.

8. A re-configurable utility meter, having a voltage signal and having a current signal, said utility meter comprising:

a current sensor;

a voltage sensor;

a DSP coupled to said current sensor and coupled to said voltage sensor, said DSP programmable by soft keys for selection of functions, said DSP comprising:

a high pass filter for filtering noise from the voltage sensor signal;

a phase corrector coupled to said high pass filter, wherein said phase corrector is adapted to correct phase error in the voltage sensor signal;

a current gain corrector coupled to said phase corrector, wherein said gain corrector is adapted to correct for gain error in the voltage sensor signal; and a re-configurable power measurement block for computing real power, reactive power, or apparent power, based on said soft key selection.

9. The re-configurable utility meter as recited in claim 8, further comprising a Time of Use (TOU) function wherein said TOU function may be selected to generate a plurality of signals indicative of energy usage over specified units of time.

10. The re-configurable utility meter as recited in claim 8, further comprising a demand function, wherein said demand function may be selected to generate a plurality of signals indicative of the rate of energy usage over specified units of time.

11. The re-configurable utility meter as recited in claim 8, further comprising an LCD display, wherein said LCD display may be selected to display power usage in two ways including the display of alpha-numeric data and binary enunciation of the rate of energy consumption.

12. The re-configurable utility meter as recited in claim 8, further comprising a calibration function, wherein said calibration function may be selected to generate at least one calibration signal.

13. A re-configurable utility meter, having a current signal and having a voltage signal, said utility meter comprising:

a current sensor;

a voltage sensor;

a DSP coupled to said current sensor and coupled to said voltage sensor, said DSP programmable by soft keys for selection of functions, said DSP comprising:

a current high pass filter for filtering noise from the current sensor signal;

a current phase corrector coupled to said current high pass filter, wherein said current phase corrector is adapted to correct phase error in the current sensor signal;

a current gain corrector coupled to said current phase corrector, wherein said current gain corrector is adapted to correct for gain error in the current sensor signal;

a voltage high pass filter for filtering noise from the voltage sensor signal;

a voltage phase corrector coupled to said voltage high pass filter, wherein said voltage phase corrector is adapted to correct phase error in the voltage sensor signal;

a voltage gain corrector coupled to said voltage phase corrector, wherein said voltage gain corrector is adapted to correct for gain error in the voltage sensor signal; and a re-configurable power measurement block for computing real power, reactive power, or apparent power, based on said soft key selection.

14. The re-configurable utility meter as recited in claim 13, further comprising a Time of Use (TOU) function, wherein said TOU function may be selected to generate a plurality of signals indicative of energy usage over specified units of time.

15. The re-configurable utility meter as recited in claim 13, further comprising a demand function, wherein said demand function may be selected to generate a plurality of signals indicative of the rate of energy usage over specified units of time.

16. The re-configurable utility meter as recited in claim 13, further comprising an LCD display, wherein said LCD display may be selected to display power usage in two ways including the display of alpha-numeric data and binary enunciation of the rate of energy consumption.

17. The re-configurable utility meter as recited in claim 13, further comprising a calibration function, wherein said calibration function may be selected to generate at least one calibration signal.

18. The re-configurable utility meter as recited in claim 13, wherein said current sensor comprises a differentiating current sensor.

19. The re-configurable utility meter as recited in claim 18, wherein said DSP further comprises an current integrator coupled to said current high pass filter, wherein said current integrator is adapted to integrate the current sensor signal.

* * * * *